United States Patent
Kang et al.

(10) Patent No.: US 10,495,938 B2
(45) Date of Patent: Dec. 3, 2019

(54) ELECTROCHROMIC ELEMENT AND METHOD FOR MANUFACTURING SAME

(71) Applicant: LG CHEM, LTD., Seoul (KR)

(72) Inventors: Soohee Kang, Daejeon (KR); Chung Wan Kim, Daejeon (KR); Song Ho Jang, Daejeon (KR); Jae Hoon Lee, Daejeon (KR); Kyoung Jin Kim, Daejeon (KR); Jin Woo Park, Daejeon (KR); Geunsik Jo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/767,731

(22) PCT Filed: Oct. 11, 2016

(86) PCT No.: PCT/KR2016/011349
§ 371 (c)(1),
(2) Date: Apr. 12, 2018

(87) PCT Pub. No.: WO2017/065472
PCT Pub. Date: Apr. 20, 2017

(65) Prior Publication Data
US 2018/0292724 A1 Oct. 11, 2018

(30) Foreign Application Priority Data
Oct. 13, 2015 (KR) .................. 10-2015-0142896

(51) Int. Cl.
*G02F 1/1523* (2019.01)
*C23C 14/08* (2006.01)
(Continued)

(52) U.S. Cl.
CPC .......... *G02F 1/1523* (2013.01); *C23C 14/083* (2013.01); *C23C 14/30* (2013.01); *C23C 14/34* (2013.01); *G02F 2001/1502* (2013.01)

(58) Field of Classification Search
CPC ........ G02F 1/155; G02F 1/153; G02F 1/1523; G02F 1/1533; G02F 1/157; G02F 1/163;
(Continued)

(56) References Cited

U.S. PATENT DOCUMENTS 5,768,004 A * 6/1998 Cogan .................. G02F 1/1523
359/269
9,213,210 B2 12/2015 Andersson Ersman et al.
(Continued)

FOREIGN PATENT DOCUMENTS

KR 10-2008-0022321 A 3/2008
KR 10-2011-0131986 A 12/2011
(Continued)

OTHER PUBLICATIONS

Andersson et al., "Electrochromic $Li_xWO_3$/polymer laminate/ $Li_yV_2O_5$ device: toward an all-solid-state smart window," Applied Optics, Optical Society of America, vol. 28, No. 15, Aug. 15, 1989, pp. 3295-3302.
(Continued)

*Primary Examiner* — Evan P Dzierzynski
*Assistant Examiner* — Sharrief I Broome
(74) *Attorney, Agent, or Firm* — Birch, Stewart, Kolasch & Birch, LLP

(57) ABSTRACT

The present application relates to an electrochromic element and a method for manufacturing the same. A method for manufacturing an electrochromic element according to an exemplary embodiment of the present application comprises: forming a first electrode on a first substrate, and then forming a first electrochromic unit on the first electrode; forming a second electrode on a second substrate, and then forming a second electrochromic unit on the second electrode; and forming an electrolyte layer between the first electrochromic unit and the second electrochromic unit, in
(Continued)

which the forming of the first electrochromic unit is carried out by an E-beam deposition method (E-beam evaporation) using a carrier gas.

10 Claims, 7 Drawing Sheets

(51) Int. Cl.
 *C23C 14/30* (2006.01)
 *C23C 14/34* (2006.01)
 *G02F 1/15* (2019.01)

(58) Field of Classification Search
 CPC ........ G02F 1/15; G02F 1/161; G02F 1/15165; G02F 2001/1555; G02F 2001/1536; G02F 2001/164; G02F 1/1503; G02F 1/1506; G02F 1/1508; G02F 2001/15145; G02F 2202/36; G02F 1/0018; G02F 1/1525; G02F 2001/1502; G02B 5/08; G02B 1/18; G02B 26/005; G02B 5/0808; G02B 5/085; G02B 13/0075; G02B 1/10; G02B 27/0006; G02B 27/58; G02B 5/003; G02B 5/005; G02B 5/04; G02B 5/205; G02B 5/23; G02B 6/0055; G02B 7/182
 See application file for complete search history.

(56) References Cited

U.S. PATENT DOCUMENTS

| | | | | |
|---|---|---|---|---|
| 2005/0237594 | A1* | 10/2005 | Ho | G02F 1/15 359/265 |
| 2009/0027758 | A1* | 1/2009 | Koshida | G02F 1/1523 359/274 |
| 2009/0323156 | A1* | 12/2009 | Shin | G02F 1/153 359/265 |
| 2009/0323159 | A1* | 12/2009 | Yoshimura | G02F 1/1523 359/270 |
| 2010/0265562 | A1 | 10/2010 | Reynolds et al. | |
| 2011/0292487 | A1 | 12/2011 | Noh et al. | |
| 2014/0145172 | A1 | 5/2014 | Yamada et al. | |

FOREIGN PATENT DOCUMENTS

| | | |
|---|---|---|
| KR | 10-2011-0132858 A | 12/2011 |
| KR | 10-2014-0035405 A | 3/2014 |
| KR | 10-2014-0086327 A | 7/2014 |
| KR | 10-2014-0089416 A | 7/2014 |
| TW | 201411258 A | 3/2014 |

OTHER PUBLICATIONS

Extended European Search Report for Application No. 16855689.2, dated Sep. 19, 2018.
International Search Report (PCT/ISA/210) issued in PCT/KR2016/011349, dated Jan. 5, 2017.

* cited by examiner

[Figure 1]
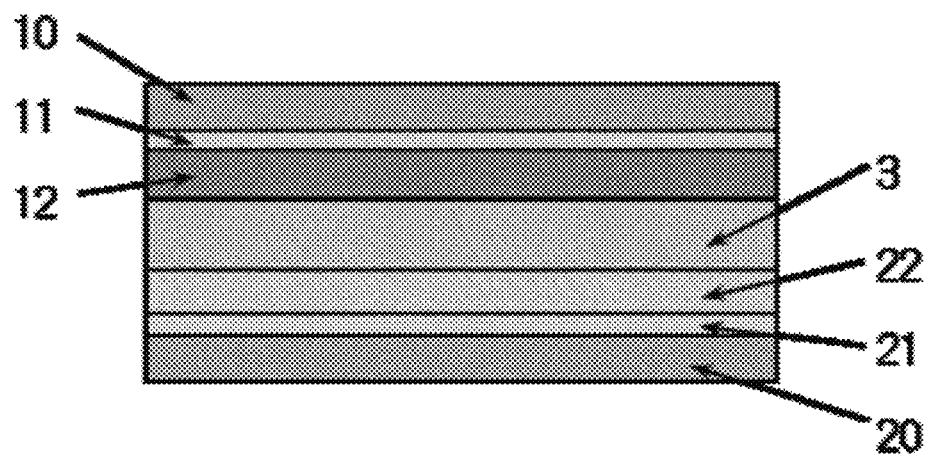
[Figure 2]
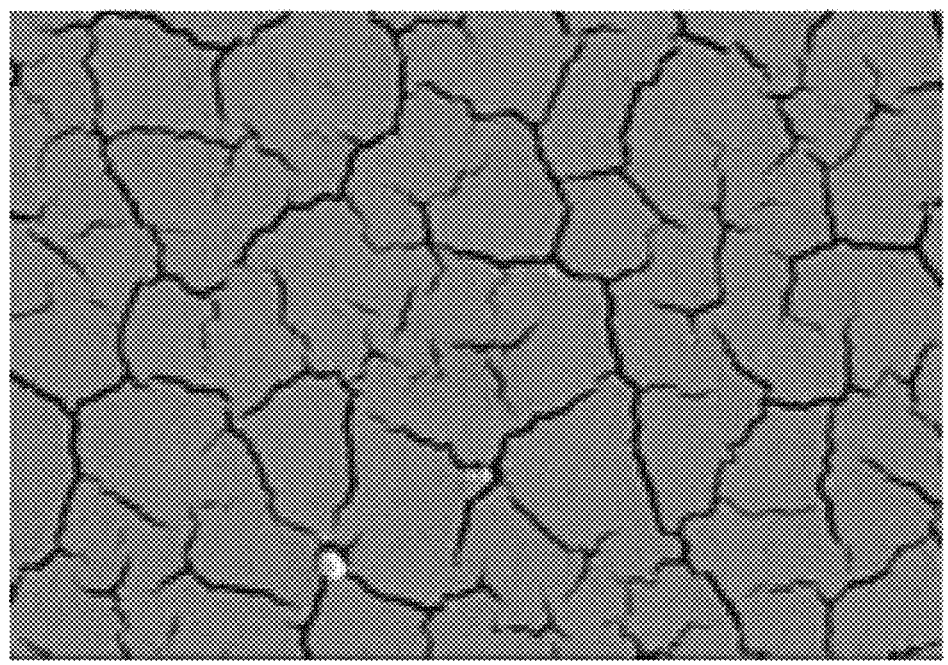

[Figure 3]
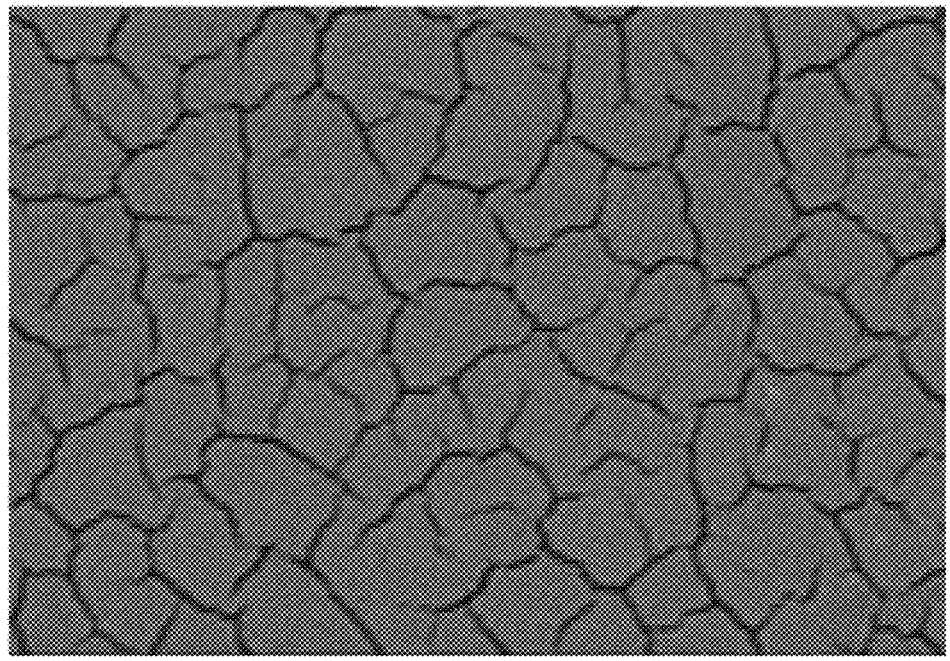
[Figure 4]
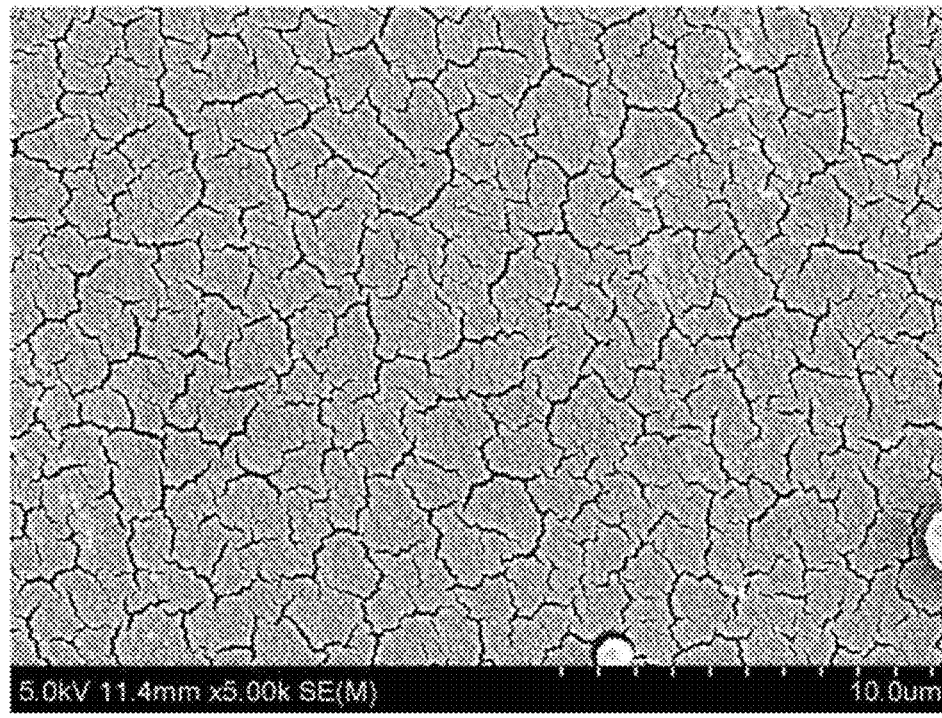

[Figure 5]
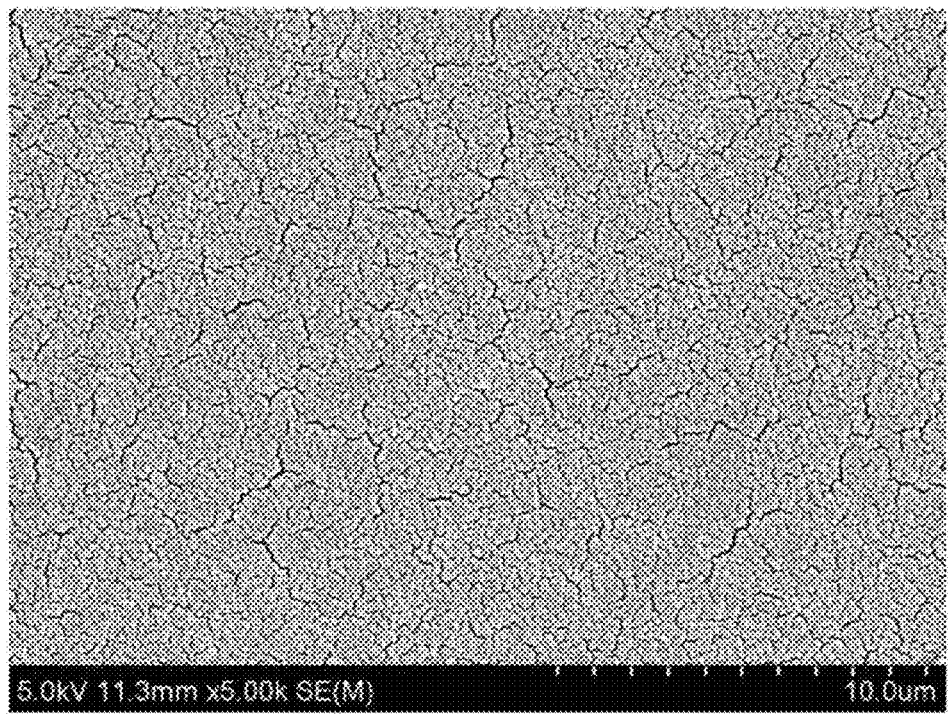
[Figure 6]
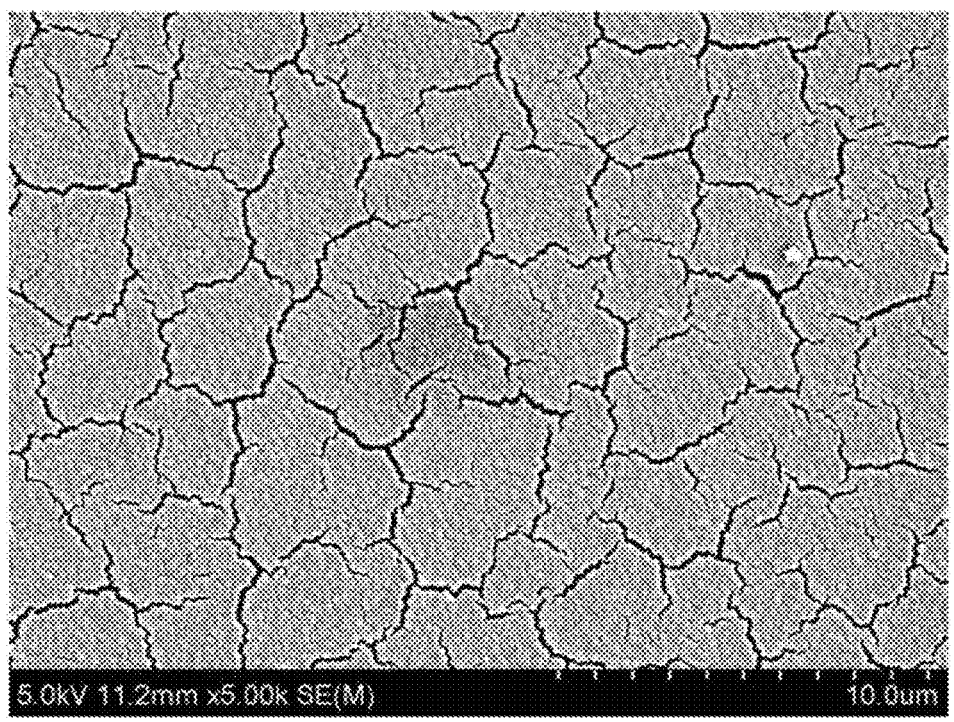

[Figure 7]
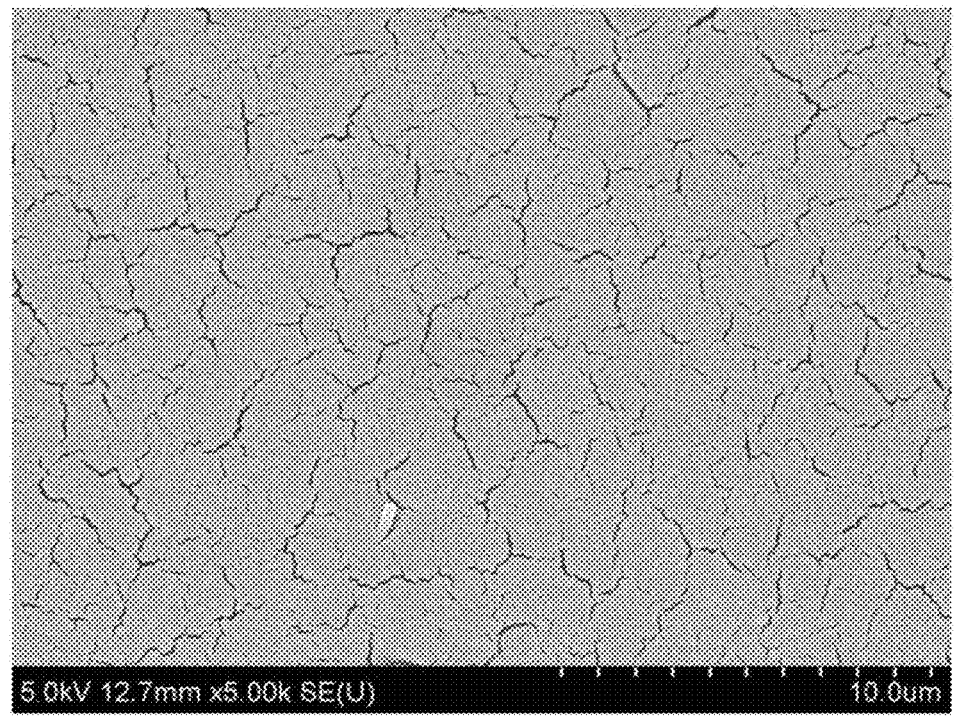
[Figure 8]
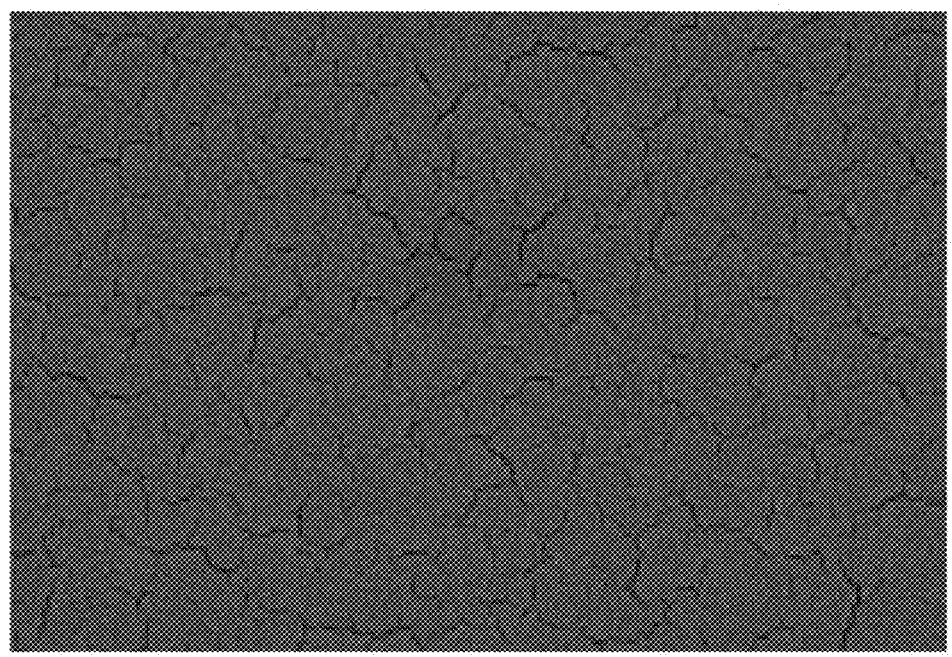

[Figure 9]
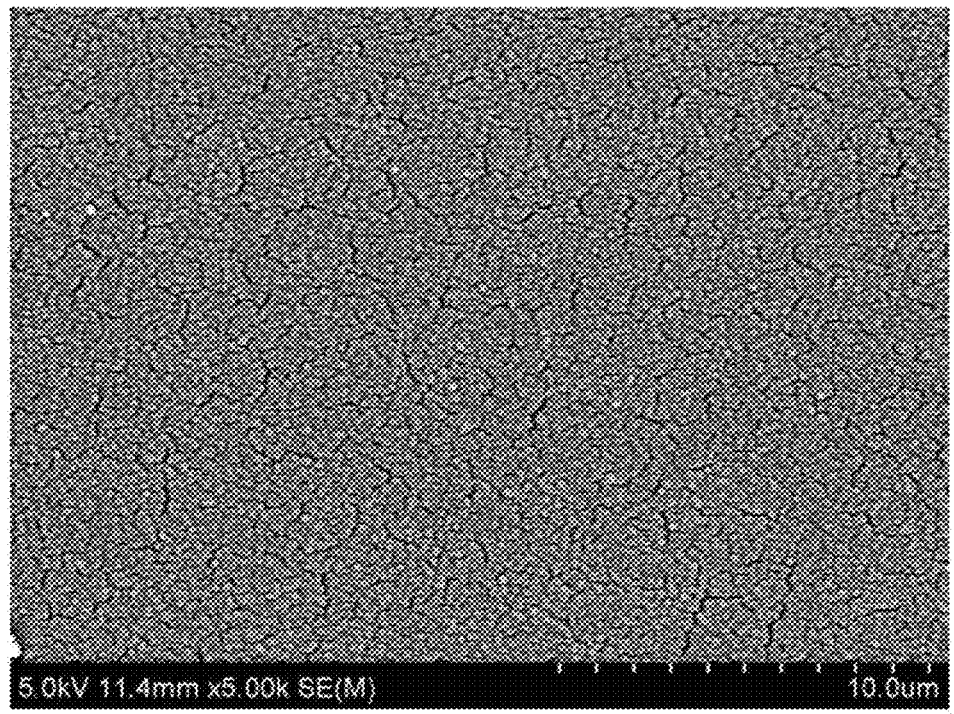
[Figure 10]
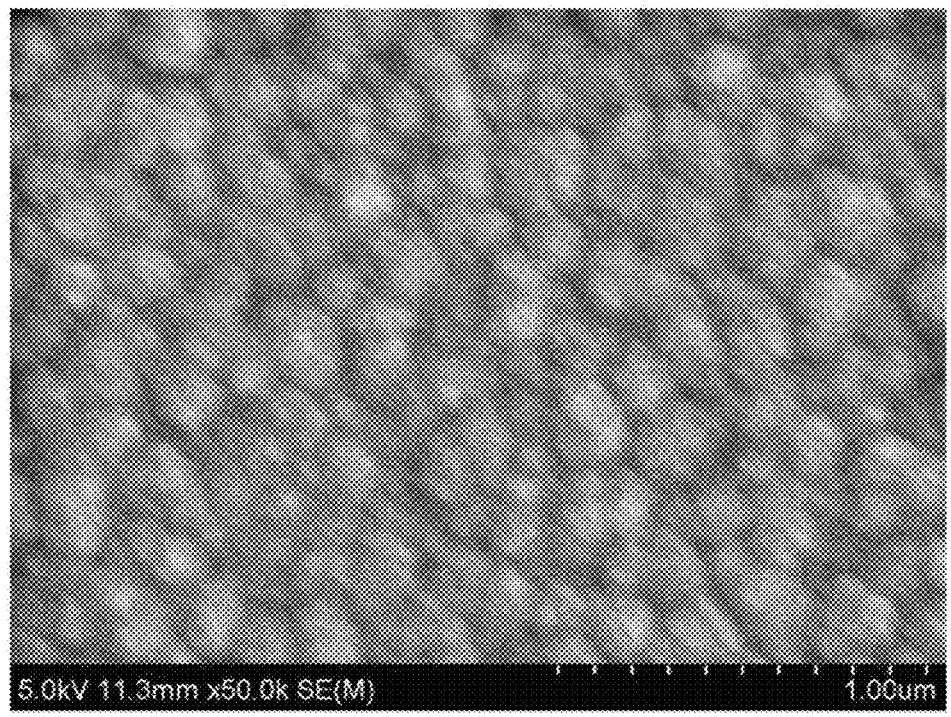

[Figure 11]
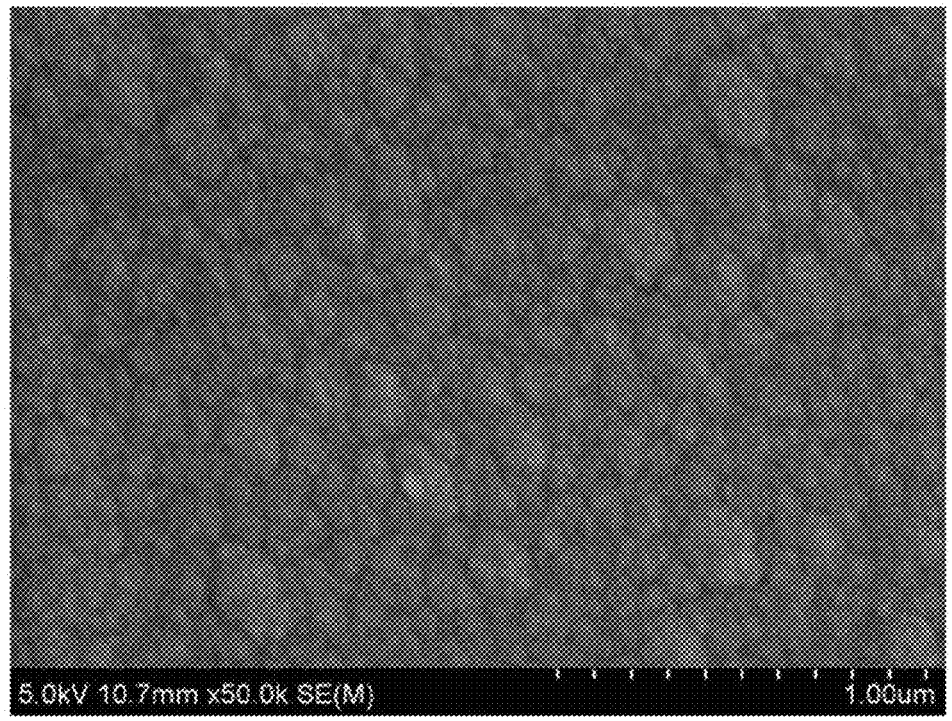
[Figure 12]
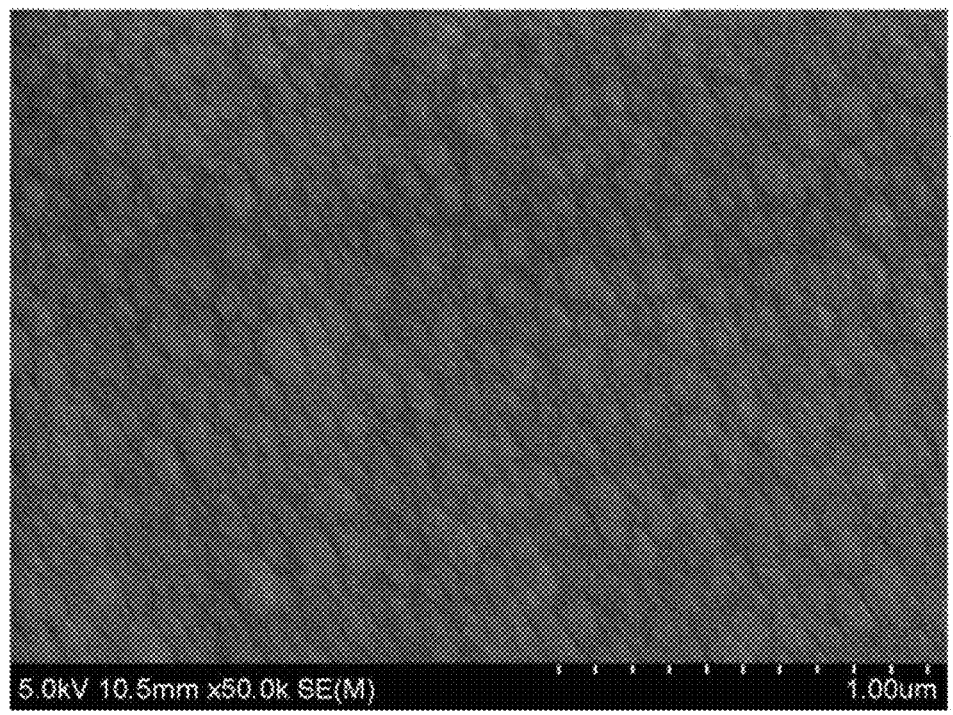

[Figure 13]
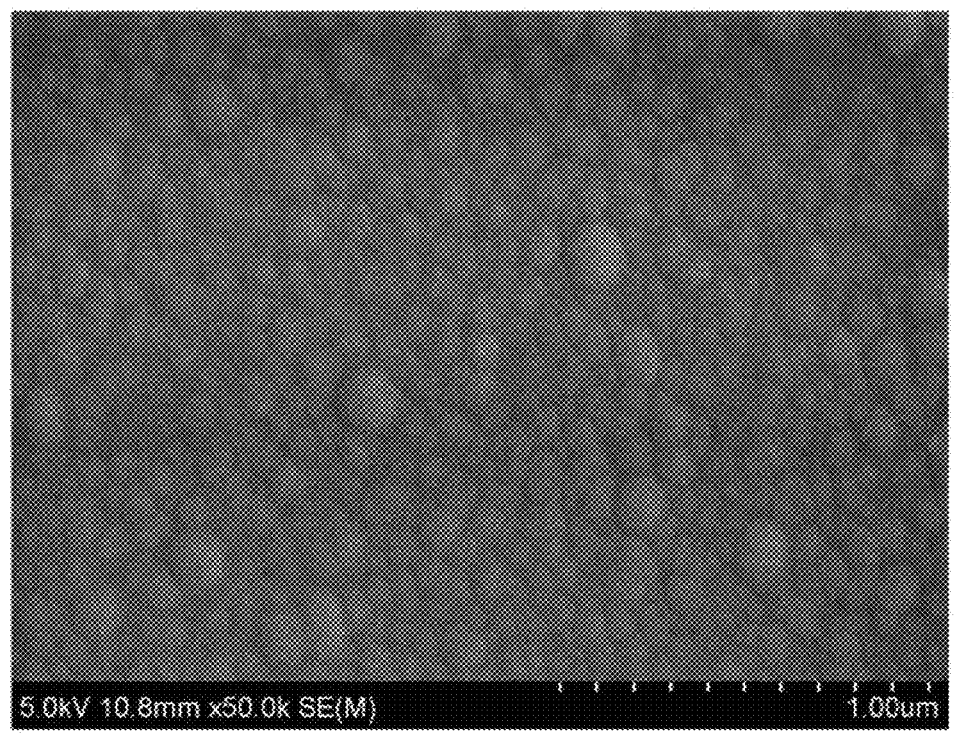

ELECTROCHROMIC ELEMENT AND METHOD FOR MANUFACTURING SAME

TECHNICAL FIELD

This application claims priority to and the benefit of Korean Patent Application No. 10-2015-0142896 filed in the Korean Intellectual Property Office on Oct. 13, 2015, the entire contents of which are incorporated herein by reference.

The present application relates to an electrochromic element and a method for manufacturing the same.

BACKGROUND ART

Electrochromism refers to a characteristic in which the color of a material is reversibly changed while the electron density is changed with the insertion or desorption of cations in an electrode structure by an electrochemical oxidation/reduction reaction, which is generated according to a change in applied voltage.

A transition metal oxide such as $WO_3$, $V_2O_5$, $TiO_2$, and NiO exhibits a hybrid conduction characteristic capable of conducting ions and electrons. When a specific potential is applied to the interface between a thin film electrode of these transition metal oxides in an electrolyte and the electrolyte, an atom such as $H^+$, $Na^+$ or $Li^+$ is charged or discharged. At this time, the color developing-color quenching process is accompanied during the charge-discharge process, so that the transition metal oxides have been actively studied as an electrode material for an electrochemical coloring element. Since a display element using the electrical coloring phenomenon may obtain a desired light transmittance level by changing an externally applied potential, the display element is expected to be used for a special glass such as a curtainless window and an electrochemical coloring display element in the form of a mirror, which uses the same.

A structure of an electrochromic element is schematically illustrated in the following FIG. 1. More specifically, the electrochromic element has a structure in which a first electrode 11, a $WO_3$ thin film 12, an electrolyte layer 3, a LiNiOx thin film 22, a second electrode 21, and a second substrate 20 are sequentially stacked on a first substrate 10.

The $WO_3$ thin film 12 is typically formed by a sputtering process, chemical vapor deposition (CVD), or a sol-gel method. The electrolyte layer 3 may use a solid or liquid state.

When a voltage is applied between the first electrode 11 and the second electrode 21, ions in the electrolyte layer 3 move and thus are reacted in the $WO_3$ thin film as in the following chemical formula, leading to chromism.

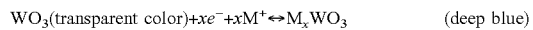

$WO_3$(transparent color)+$xe^-$+$xM^+$↔$M_xWO_3$ (deep blue)

At this time, cations in the electrolyte layer 3 move through cracks or a free volume in the $WO_3$ thin film 12, and a thickness of the $WO_3$ thin film 12 needs to be increased in order to enhance a coloring degree, but there is a problem in that as a moving distance of cations is increased, a discoloration rate becomes slow.

Further, in constituting an electrochromic element, $WO_3$ thin films were prepared by using a sputtering method in the related art. However, the sputtering method has a problem in that the method is not suitable for mass production because process equipment is expensive and a deposition rate is too slow to manufacture a $WO_3$ thin film having a thickness of several hundred nanometers.

DETAILED DESCRIPTION OF THE INVENTION

Technical Problem

In the art, there is a need for developing technologies for an electrochromic element having a simple manufacturing process and an excellent performance and a method for manufacturing the same.

Technical Solution

An exemplary embodiment of the present application provides a method for manufacturing an electrochromic element, the method comprising:

forming a first electrode on a first substrate, and then forming a first electrochromic unit on the first electrode, forming a second electrode on a second substrate, and then forming a second electrochromic unit on the second electrode, and forming an electrolyte layer between the first electrochromic unit and the second electrochromic unit, in which the forming of the first electrochromic unit is carried out by an E-beam deposition method (E-beam evaporation) using a carrier gas.

Further, another exemplary embodiment of the present application provides an electrochromic element manufactured by the method for manufacturing an electrochromic element.

Advantageous Effects

An electrochromic element according to an exemplary embodiment of the present application is characterized by being capable of forming a first electrochromic unit at a much higher rate than a sputtering process in the related art, by forming a first electrochromic unit by an E-beam deposition method (E-beam evaporation). Further, the electrochromic element according to an exemplary embodiment of the present application is characterized by being capable of forming a WOx thin film at a much higher rate than a sputtering process in the related art or general E-beam deposition method (E-beam evaporation), by forming a first electrochromic unit comprising a WOx (x is 1.17 to 1.30) thin film by the E-beam deposition method (E-beam evaporation) while injecting one or more carrier gases such as Ar, $N_2$, and $O_2$, and being capable of significantly lowering a WOx thin film density.

In addition, the electrochromic element according to an exemplary embodiment of the present application may implement excellent performances in which a difference between coloration and decoloration is great and a discoloration time is fast, by comprising the first electrochromic unit formed by the E-beam deposition method (E-beam evaporation).

BRIEF DESCRIPTION OF DRAWINGS

FIG. 1 is a view schematically illustrating a structure of an electrochromic element as an exemplary embodiment of the present application.

FIG. 2 is a view illustrating an SEM photograph of a surface of a first electrochromic layer according to Example 2 of the present application.

FIG. 3 is a view illustrating an SEM photograph of a surface of a first electrochromic layer according to Example 4 of the present application.

FIG. 4 is a view illustrating an SEM photograph of a surface of a first electrochromic layer according to Example 3 of the present application.

FIG. 5 is a view illustrating an SEM photograph of a surface of a first electrochromic layer according to Example 5 of the present application.

FIG. 6 is a view illustrating an SEM photograph of a surface of a first electrochromic layer according to Example 6 of the present application.

FIG. 7 is a view illustrating an SEM photograph of a surface of a first electrochromic layer according to Example 7 of the present application.

FIG. 8 is a view illustrating an SEM photograph of a surface of a first electrochromic layer according to Example 8 of the present application.

FIG. 9 is a view illustrating an SEM photograph of a surface of a first electrochromic layer according to Example 9 of the present application.

FIG. 10 is a view illustrating an SEM photograph of a surface of a first electrochromic layer according to Comparative Example 1 of the present application.

FIG. 11 is a view illustrating an SEM photograph of a surface of a first electrochromic layer according to Comparative Example 2 of the present application.

FIG. 12 is a view illustrating an SEM photograph of a surface of a first electrochromic layer according to Comparative Example 3 of the present application.

FIG. 13 is a view illustrating an SEM photograph of a surface of a first electrochromic layer according to Comparative Example 4 of the present application.

EXPLANATION OF REFERENCE NUMERALS AND SYMBOLS

10: First substrate
11: First electrode
12: First electrochromic unit
3: Electrolyte layer
22: Second electrochromic unit
21: Second electrode
20: Second substrate

BEST MODE

Hereinafter, the present application will be described in more detail.

As a process of forming a $WO_3$ thin film as a first electrochromic unit of an electrochromic element in the related art, there have been usually used methods for preparing $WO_3$ on a glass substrate usually coated with indium-tin oxide (ITO) and fluorine tin oxide (FTO) by using an electroplating method, or forming crystalline $WO_3$ on a glass substrate by performing coating on a glass substrate using a dry coating method such as sputtering or using a sol-gel coating method, and then subjecting the glass substrate to a high temperature treatment at 250° C. or more. At this time, when the high temperature treatment is not performed, an amorphous $WO_3$ thin film is formed, and when colored, the amorphous $WO_3$ thin film absorbs light in a visible light region, but transmits light in an infrared region, so that the amorphous $WO_3$ thin film does not have a good heat shielding property, and it is known that the $WO_3$ thin film has a problem with durability when used for a long period of time. Further, there is a problem in that it is difficult to use the $WO_3$ thin film for a plastic base material when the high temperature treatment is performed. In addition, when a thickness of the thin film is increased to 200 nm or more, cracks occur on the thin film, so that there occurs a problem with durability of an electrode, and as a result, it is not possible to increase the thickness of the thin film, and when the thickness of the thin film is formed at 200 nm or less, there is a problem in that the thin film has a low contrast.

Furthermore, methods for increasing a coating thickness by adding acid such as citric acid or acetic acid ($CH_3COOH$) to a sol-gel process have also been introduced, but since these methods are also inevitably subjected to a sintering temperature at 250° C. or more, there is a problem in that it is difficult to use the methods for a plastic base material, and when an electroplating method is used, a thin film can be formed by a wet process, but there are disadvantages in that it takes a considerable time to obtain an electrode thin film, it is difficult to perform coating onto a flexible plastic substrate with a large area, and there is a limitation on equipment. Further, a sputtering method can use both a plastic base material and a glass base material, but has disadvantages in that the price of a product is high by using expensive equipment, and there are several difficulties in the process.

In addition, there also has been proposed a method for forming a $WO_3$ thin film by preparing crystalline tungsten nanoparticles, dispersing the crystalline tungsten nanoparticles in a solvent such as ethylene glycol, and then coating the resulting solution on a glass substrate, and evaporating the solvent through a high-temperature heat treatment, but the method also has a restriction that only a glass substrate needs to be used. Furthermore, it has been proposed that crystalline nanoparticles are prepared, the crystalline nanoparticles are dispersed by together using a polymer dispersant or other dispersants, and then the resulting dispersion can be used in a low-temperature process by being mixed with an organic binder such as a polymer or an inorganic binder, but in this case, the dispersion can be used in a low-temperature process and a plastic base material, but has disadvantages in that coloration and decoloration rates become slow because there is a problem with oxidation and reduction rates affecting electrode chromic properties.

Thus, the present application is intended to provide a method for manufacturing an electrochromic element capable of overcoming low productivity of a sputtering method in the related art.

A method for manufacturing an electrochromic element according to an exemplary embodiment of the present application comprises: forming a first electrode on a first substrate, and then forming a first electrochromic unit on the first electrode, forming a second electrode on a second substrate, and then forming a second electrochromic unit on the second electrode, and forming an electrolyte layer between the first electrochromic unit and the second electrochromic unit, in which the forming of the first electrochromic unit is carried out by an E-beam deposition method (E-beam evaporation) using a carrier gas.

In the present application, the first substrate, the second substrate, the first electrode, and the second electrode are not particularly limited as long as the first substrate, the second substrate, the first electrode, and the second electrode are publicly-known in the art. More specifically, examples of the first substrate and the second substrate comprise a glass substrate, a plastic substrate, and the like, but are not limited thereto. Further, the first electrode and the second electrode may each independently comprise indium doped tin oxide (ITO), antimony doped tin oxide (ATO), fluorine doped tin oxide (FTO), indium doped zinc oxide (IZO), ZnO, or the like, but are not limited thereto.

In the present application, as a method for forming the first electrode on the first substrate and a method for forming the second electrode on the second substrate, methods known in the art may be used. For example, the first electrode or the second electrode may be formed on the first substrate or the second substrate by using materials for the first electrode or the second electrode and using sputtering, E-beam deposition, chemical vapor deposition, a sol-gel coating method, and the like, but the forming method is not limited thereto.

In the method for manufacturing an electrochromic element according to the present application, an deposition rate may be increased by using an E-beam deposition method (E-beam evaporation) using a carrier gas in the forming of the first electrochromic unit. More specifically, the carrier gas may serve as a carrier of a source so as to more rapidly evaporate an E-beam deposition source.

In the present application, as the carrier gas, a carrier gas known in the art may be used. More specifically, the carrier gas may comprise one or more of Ar, $N_2$, $O_2$, $H_2$, He, CO, Ne, and the like, and it is preferred that the carrier gas comprises one or more of Ar, $N_2$, $O_2$, and the like, but the carrier gas is not limited thereto.

In the present application, the first electrochromic unit may comprise a thin film comprising one or more of WOx (x is 1.17 to 1.30), $Bi_2O_3$, CoO, $MoO_3$, $Nb_2O_5$, and $TiO_2$, but is not limited thereto.

In the present application, the first electrochromic unit comprises a WOx (x is 1.17 to 1.30), and the E-beam deposition method (E-beam evaporation) may use a $WO_3$ source, but is not limited thereto.

When the WOx thin film is formed, a process pressure according to the kind or amount of carrier gas during an E-beam deposition process may be controlled by introducing one or more carrier gases into a vacuum chamber. Further, the gas may serve as a carrier of a source so as to more rapidly evaporate an E-beam deposition source.

During the E-beam deposition, the process conditions are a high voltage of 6.03 kV, a current of 1.45 to 1.50 mA, and a working pressure of approximately 1.0 to 8.0E-4 Torr according to the amount of gas, and a high process pressure can be maintained as compared to a process pressure when an evaporation is performed without putting a carrier gas.

In the present application, in forming a thickness for securing electrochromic properties by using a sputtering technology in the related art, a polymer substrate is subjected to thermal stress, so that an adverse problem occurs during the driving due to warpage, a problem with durability, and physical cracks. In addition, when thin films are deposited as a first electrochromic unit and a second electrochromic unit, a problem with durability and the occurrence of cracks are more and more accelerated due to a difference in CTE between the respective thin films. For this reason, the E-beam deposition method (E-beam evaporation) capable of maintaining thermal stability is suitable for using a polymer substrate.

A general E-beam deposition method (E-beam evaporation) may also be less subjected to thermal stress, but the present application may bring effects of improving productivity and reducing production costs through an increase in deposition thickness by introducing one or more carrier gases during the E-beam deposition process. Furthermore, the lower densities of the thin films as the first electrochromic unit and the second electrochromic unit lead to excellent electrochromism characteristics, and thus may bring an improvement in electrochromic driving capability required in the art.

In particular, in the present application, the first electrochromic unit comprises a WOx (x is 1.17 to 1.30) thin film, and the WOx thin film may have a density of 5.8 $g/cm^3$ or less or 2.5 to 5.8 $g/cm^3$.

A $WO_3$ thin film formed by a sputtering process in the related art has a density of 6.3 $g/cm^3$ or more, but the WOx thin film according to the present application is formed by an E-beam deposition method (E-beam evaporation) using one or more carrier gases and thus may have a density of 5.8 $g/cm^3$ or less.

According to the present application, deposition particles may be sparsely formed before the carrier gas accelerates a deposition material, so that a thin film is formed, by introducing one or more carrier gases during the E-beam deposition process, and the process pressure may be increased by the carrier gas, and as a result, the WOx thin film according to the present application may have a lower density than that in the related art as described above.

According to the present application, since the thin film density of the first electrochromic unit is low, a specific surface area where Li ions comprised in the electrolyte layer may be reacted with the thin film as the electrochromic unit within a unit time is increased, so that the Li ions may be rapidly reacted during the conversion process of coloration and decoloration, and a difference in transmittance between coloration and decoloration may be increased.

In the present application, the second electrochromic unit may comprise a thin film comprising one or more of $LiNi_aO_b$ (a is 1.3 to 2.2 and b is 2.3 to 3.6), FeO, NiO, $RhO_5$, and $V_2O_5$, but is not limited thereto.

The second electrochromic unit may be formed by using a method known in the art. Furthermore, the second electrochromic unit may also be formed by an E-beam deposition method (E-beam evaporation) using the above-described carrier gas.

In the present application, the forming of the electrolyte layer may comprise: forming an electrolyte film by coating an electrolyte solution on a first release film, then laminating a second release film with the first release film and UV-curing the laminate, removing the first release film and transferring the electrolyte film onto the first electrochromic unit, and removing the second release film and laminating a second electrochromic unit on the electrolyte film.

The first release film, the second release film, and the electrolyte layer may be formed by using materials and methods known in the art.

More specifically, the electrolyte layer may comprise a lithium salt, a plasticizer, an oligomer, a monomer, an additive, a radical initiator, and the like. The oligomer used herein needs to have compatibility with a plasticizer. The electrolyte layer formed by using the UV curing reaction has not only excellent ionic conductivity, but also high transmittance and low haze, and thus may proficiently implement the performance of an electrochromic element as a transparent solid electrolyte.

Further, another exemplary embodiment of the present application provides an electrochromic element manufactured by the method for manufacturing an electrochromic element.

In the electrochromic element according to the present application, the first electrochromic unit comprises a WOx (x is 1.17 to 1.30) thin film, and the WOx thin film may have a density of 5.8 $g/cm^3$ or less.

In addition, in the electrochromic element according to the present application, the second electrochromic unit may comprise a $LiNi_aO_b$ (a is 1.3 to 2.2, and b is 2.3 to 3.6) thin film.

Furthermore, the electrochromic element according to the present application may implement excellent performances in which a difference between coloration and decoloration is great and a discoloration time is fast, by comprising the first electrochromic unit formed by the E-beam deposition method (E-beam evaporation).

MODE FOR INVENTION

Hereinafter, the present invention will be described in more detail through Examples, Comparative Examples, and Experimental Examples. However, the following Examples, Comparative Examples, and Experimental Examples are provided for exemplifying the present invention, and the scope of the present invention is not limited thereby.

EXAMPLES

Examples 1 to 10

1) Manufacture of First Electrochromic Layer

A thin film with a thickness of 350 nm and Rs of 15 ohm/sq or less as a conductive layer was formed on a glass base material by means of a DC sputtering method by using an ITO single target. Thereafter, a $WO_3$ source was set at a high voltage (HV) of 6.03 kV and an evaporation rate which is a depo rate of 0.5 nm/s by an E-beam deposition method (E-beam evaporation) to manufacture a thin film. In the case of the Example, before the deposition was initiated as in the following Table 1, a flow rate of a carrier gas connected to a chamber was adjusted under the conditions in the following Table 1, thereby manufacturing a first electrochromic layer.

2) Manufacture of Second Electrochromic Layer

A thin film with a thickness of 300 nm and Rs of 20 ohm/sq or less as a conductive layer was formed on a PET (film) base material by means of a DC sputtering method by using an ITO single target. Thereafter, plasma was formed on a $LiNiO_2$ target by using a DC sputter, and then a thin film was manufactured, such that LiNiaO (a is 1.3 to 2.2 and b is 2.3 to 3.6) could be formed through a reactive reaction by injecting Ar and $O_2$ gases into a chamber. At this time, the recipe conditions were as follows: Ar and $O_2$ were flowed at 50 sccm and 50 sccm, respectively, with an applied power of 2 kWatt, and a second electrochromic layer was manufactured by equally adjusting the process pressure to 20 mTorr.

Comparative Example 1

A thin film with a thickness of 350 nm and Rs of 15 ohm/sq or less as a conductive layer was formed on a glass base material by means of a DC sputtering method by using an ITO single target. Thereafter, a $WO_3$ source was set at a high voltage (HV) of 6.03 kV and an evaporation rate which is a depo rate of 0.5 nm/s by an E-beam deposition method (E-beam evaporation) to manufacture a first electrochromic layer.

Comparative Examples 2 to 4

A thin film with a thickness of 350 nm and Rs of 15 ohm/sq or less as a conductive layer was formed on a glass base material by means of a DC sputtering method by using an ITO single target. Thereafter, plasma was formed on a W target by using a DC sputter, and then a thin film was manufactured, such that $WO_3$ could be formed through a reactive reaction by injecting Ar and $O_2$ gases into a chamber. At this time, the recipe conditions were as follows: Ar and $O_2$ were flowed at 30 sccm and 50 sccm, respectively, with an applied power of 3 kWatt, and a first electrochromic layer was manufactured by varying the process pressure condition in Comparative Example 2 (20 mTorr), Comparative Example 3 (15 mTorr), and Comparative Example 4 (5 mTorr).

TABLE 1

| | Gas flow (sccm) | Power (kV) | Thickness (nm) of First Electrochromic Layer | Deposition Rate (nm/min) of First Electrochromic Layer |
|---|---|---|---|---|
| Example 1 | Ar 30 | 6.03 | 1,765 | 58.8 |
| Example 2 | Ar 50 | 6.03 | 850 | 141.6 |
| Example 3 | $O_2$ 50 | 6.03 | 420 | 105 |
| Example 4 | $N_2$ 50 | 6.03 | 800 | 133.3 |
| Example 5 | $O_2$ 100 | 6.03 | 750 | 250 |
| Example 6 | Ar 50 + $O_2$ 50 | 6.03 | 760 | 253 |
| Example 7 | Ar 50 + $N_2$ 50 | 6.03 | 650 | 217 |
| Example 8 | $O_2$ 50 + $N_2$ 50 | 6.03 | 710 | 237 |
| Example 9 | Ar 50 + $O_2$ 50 + $N_2$ 50 | 6.03 | 720 | 360 |
| Example 10 | Ar 50 + $O_2$ 100 + $N_2$ 50 | 6.03 | 1,450 | 725 |
| Comparative Example 1 | — | 6.03 | 320 | 12.8 |

TABLE 2

| | Comparative Example 2 | Comparative Example 3 | Comparative Example 4 |
|---|---|---|---|
| DC Power (W) | 3,000 | 3,000 | 3,000 |
| Ar (sccm) | 30 | 30 | 30 |
| $O_2$ (sccm) | 50 | 50 | 50 |
| Pressure (mTorr) | 20 | 15 | 5 |
| Thickness (nm) of First Electrochromic Layer | 430 | 393 | 426 |
| Deposition Rate (nm/min) of First Electrochromic Layer | 8.9 | 8.9 | 8.9 |

The deposition rates of the first electrochromic layers in Tables 1 and 2 are values calculated by using the deposition thickness.

Experimental Example

The thin film density, coloration transmittance, decoloration transmittance, coloration time, and decoloration time of the first electrochromic layers in Examples 1 to 3 and Comparative Examples 1 to 4 were evaluated, and are shown in the following Table 3.

TABLE 3

| | Thin film density (g/cm³) | Coloration transmittance (%) | Decoloration transmittance (%) | Coloration time (sec) | Decoloration time (sec) |
|---|---|---|---|---|---|
| Example 1 | 5.0 ± 0.2 | 1.0 | 48.8 | 61 | 26 |
| Example 2 | 4.0 ± 0.2 | 13.8 | 61.3 | 31.2 | 13.1 |
| Example 3 | 5.7 ± 0.2 | 2.4 | 59.3 | 40.8 | 18.2 |
| Comparative Example 1 | 5.8 ± 0.1 | 10.3 | 78 | 20.6 | 8.7 |
| Comparative Example 2 | 6.3 ± 0.1 | 7.8 | 78.6 | 60.5 | 20.7 |
| Comparative Example 3 | 6.4 ± 0.1 | 12.5 | 81.3 | 70.8 | 22.7 |
| Comparative Example 4 | 6.5 ± 0.1 | 13.4 | 65.7 | 100 | 17.5 |

The thin film density of the first electrochromic layer was measured for each 1 sec per every 0.002 degree at 2 theta from 0.2 degree to 2.4 degree by using an X-ray reflectometry (XRR) analysis method. An experiment was performed so as to achieve coloration and decoloration by using potentiostat equipment for performing electrochromism. The transmittances of the coloration and decoloration were scanned in a wavelength band from 250 nm to 2,300 nm by using UV-vis equipment, and an analysis result was obtained as a transmittance in a visible region band (550 nm) generally used. The time (switching time) for the coloration and decoloration was confirmed as a difference in reaction time at a coloration and decoloration peak current level of 80% after the coloration and decoloration (1 cycle) was performed (activation) 5 cycles.

Further, the SEM photographs of the surfaces of the first electrochromic layers in Examples 2 to 9 and Comparative Examples 1 to 4 were illustrated in the following FIGS. 2 to 13.

An electrochromic element according to an exemplary embodiment of the present application is characterized by being capable of forming a first electrochromic unit at a much higher rate than a sputtering process in the related art, by forming a first electrochromic unit by an E-beam deposition method (E-beam evaporation). Further, the electrochromic element according to an exemplary embodiment of the present application is characterized by being capable of forming a WOx thin film at a much higher rate than a sputtering process in the related art or general E-beam deposition method, by forming a first electrochromic unit comprising a WOx (x is 1.17 to 1.30) thin film by the E-beam deposition method (E-beam evaporation) while injecting one or more carrier gases such as Ar, $N_2$, and $O_2$, and being capable of significantly lowering the WOx thin film density.

In addition, the electrochromic element according to an exemplary embodiment of the present application may implement excellent performances in which a difference between coloration and decoloration is great and a discoloration time is fast, by comprising the first electrochromic unit formed by the E-beam deposition method (E-beam evaporation).

The invention claimed is:

1. A method for manufacturing an electrochromic element, the method comprising:
    forming a first electrode on a first substrate, and then forming a first electrochromic unit on the first electrode,
        wherein the first electrochromic unit comprises a WOx (x is 1.17 to 1.30) thin film, and the WOx thin film has a density of 5.8 g/cm³ or less;
    forming a second electrode on a second substrate, and then forming a second electrochromic unit on the second electrode; and
    forming an electrolyte layer between the first electrochromic unit and the second electrochromic unit,
    wherein the forming of the first electrochromic unit is carried out by an E-beam deposition method (E-beam evaporation) using a carrier gas.

2. The method of claim 1, wherein the carrier gas comprises one or more of Ar, $N_2$, $O_2$, $H_2$, He, CO, and Ne.

3. The method of claim 1, wherein the forming of the electrolyte layer comprises:
    forming an electrolyte film by coating an electrolyte solution on a first release film, then laminating a second release film with the first release film and UV-curing the laminate;
    removing the first release film and transferring the electrolyte film onto the first electrochromic unit; and
    removing the second release film and laminating the second electrochromic unit on the electrolyte film.

4. The method of claim 1, wherein the first electrochromic unit thin film further comprises one or more of $Bi_2O_3$, CoO, $MoO_3$, $Nb_2O_5$, and $TiO_2$.

5. The method of claim 1, wherein the E-beam deposition method (E-beam evaporation) uses a $WO_3$ source.

6. The method of claim 1, wherein the second electrochromic unit comprises a thin film comprising one or more of $LiNi_aO_b$ (a is 1.3 to 2.2 and b is 2.3 to 3.6), FeO, NiO, $RhO_5$, and $V_2O_5$.

7. The method of claim 1, wherein the first substrate and the second substrate are each independently a glass substrate or a plastic substrate.

8. The method of claim 1, wherein the first electrode and the second electrode each independently comprise one or more of indium doped tin oxide (ITO), antimony doped tin oxide (ATO), fluorine doped tin oxide (FTO), indium doped zinc oxide (IZO), and ZnO.

9. An electrochromic element manufactured by the method for manufacturing an electrochromic element according to claim 1.

10. The electrochromic element of claim 9, wherein the second electrochromic unit comprises a $LiNi_aO_b$ (a is 1.3 to 2.2 and b is 2.3 to 3.6) thin film.

* * * * *